United States Patent [19]
Datri et al.

[11] Patent Number: 5,920,112
[45] Date of Patent: Jul. 6, 1999

[54] CIRCUIT INCLUDING A CORRAL FOR CONTAINING A PROTECTIVE COATING, AND METHOD OF MAKING SAME

[75] Inventors: Theodore D. Datri, Millis; Serena I. Wood, Charlton, both of Mass.

[73] Assignee: Micro Networks Corporation, Worcester, Mass.

[21] Appl. No.: 09/056,306

[22] Filed: Apr. 7, 1998

[51] Int. Cl.[6] .................................................. H01L 21/302
[52] U.S. Cl. ...................... 257/619; 257/620; 257/638; 257/667; 257/670
[58] Field of Search ................................... 257/203, 206, 257/207, 484, 619, 620, 638, 672, 690, 779, 780, 781, 786, 788, 796, 678

[56] References Cited

U.S. PATENT DOCUMENTS

| | | |
|---|---|---|
| 4,663,190 | 5/1987 | Fujita et al. .............................. 257/793 |
| 4,771,330 | 9/1988 | Long ........................................ 257/672 |
| 4,821,151 | 4/1989 | Pryor et al. .............................. 361/771 |
| 5,258,334 | 11/1993 | Lantz, II .................................. 438/760 |
| 5,258,575 | 11/1993 | Beppu et al. ............................ 257/678 |
| 5,311,060 | 5/1994 | Rostoker et al. ....................... 257/796 |
| 5,468,990 | 11/1995 | Daum ....................................... 257/632 |
| 5,583,375 | 12/1996 | Tsubosaki et al. ...................... 257/692 |
| 5,729,437 | 3/1998 | Hashimoto ............................... 257/788 |

*Primary Examiner*—Tom Thomas
*Assistant Examiner*—Luan Thai
*Attorney, Agent, or Firm*—Kirkpatrick & Lockhart LLP

[57] ABSTRACT

A circuit including an active area, at least one bond pad and a corral formed on the circuit between the active area and the bond pad. A method including providing a circuit with an active area and at least one bond pad and forming a corral on the circuit between the active area and the bond pad. Embodiments of the present invention contain materials placed over the active area of a circuit preventing them from engaging areas outside the corral.

16 Claims, 5 Drawing Sheets

CIRCUIT INCLUDING A CORRAL FOR CONTAINING A PROTECTIVE COATING, AND METHOD OF MAKING SAME

CROSS-REFERENCE TO RELATED APPLICATIONS

Not Applicable.

FEDERALLY SPONSORED RESEARCH

Not Applicable.

BACKGROUND OF THE INVENTION

1. Field of the Invention

The present invention relates to a circuit, more particularly, a circuit including a corral for containing a protective coating and a method of making same.

2. Description of the Invention Background

Products, such as circuits, may be reverse engineered to determine their design and operation. For example, reverse engineering of a circuit may be performed by opening the package containing a circuit and viewing the components and interconnections that make up the circuit. To reverse engineer multiple layered circuits, the top layer of the circuit is viewed, then it is removed and the next layer is viewed. That process may be repeated for each layer in the circuit. Layers may be viewed through a microscope or through the use of photography. Layers may be removed by a grinding process using a mild abrasive or through a chemical process.

Products, such as circuits, may be protected from reverse engineering by covering them with a protective coating to prevent reverse engineering. The protective coating is designed to conceal the circuit from visual inspection and to physically destroy the circuit if removed. The protective coating also prevents tampering with circuits and protects it from contaminants and outside forces that may damage the circuit, such as ultraviolet light and static electricity. Protective coatings come in many varieties, and the problems with the prior art generally apply to all such coatings.

Primers are often used in conjunction with coatings. Primers may have many functions including possessing inherent protective qualities and being an agent that will adhere to the surface of the circuit and to which the coating will adhere. It is important that coatings properly adhere so that they remain in place where they can serve their required function. Most tamper resistant materials are intended to destroy the circuit when removed. Therefore, adherence of tamper resistant materials is particularly important.

Both coatings and processes for placing such coatings currently exist. Those coatings, however, often cause the circuits on which they are used to fail, and the processes for placing them are not efficient. One reason for circuit failure is that the distribution of the coating is not adequately controlled. For example, a common placement method is to manually dispense a liquid primer layer, cure the primer layer, manually dispense a liquid tamper resistant material, and cure the tamper resistant material. It is necessary for the primer and tamper resistant material to be placed in a substantial quantity in order to adequately cover and protect the circuit. Therefore, the primer and tamper resistant material flow across the circuit. The result is uneven coating of the active area of the circuit and reduced protection of lightly coated areas.

Additionally, when employing the prior art method, the wires and package must be attached to the circuit before the primer and tamper resistant coating are applied. That is because the primer and tamper resistant coating typically cover the bond pads, thereby preventing attachment to the bond pads at a later time.

Another disadvantage is that prior art leaves the circuit unprotected during much of its processing, including during dicing of circuits from the wafer, attachment of the circuit to the package, and bonding of wires to the circuit's bond pads. As a result, the prior art allows a significant risk that an unprotected circuit may be withdrawn and reverse engineered.

Another disadvantage to the prior art involves the risk to encryption codes, such as classified keys, which may be determined by examining an encrypted circuit prior to the application of the protective coating. Encryption typically requires access to the bond pads, so the prior art requires encryption to be performed prior to applying the protective coating. Therefore, such circuits are encoded prior to placement of the primer and tamper resistant coating, which may cover the bond pads, and remain unprotected until the protective coating is applied during packaging. As a result, greater security precautions are required to protect the circuit and encryption keys, thereby increasing the cost and potential for loss. The prior art also has an increased failure rate because classification keys can be erased or altered during the high temperature curing steps required after the application of the protective coating.

Another source of failure in the prior art is the wires attached to the circuit's bond pads. Unusually high failures are caused when the primer and protective coating harden during the curing process. The hardened primer and protective coating and high temperatures often break the contact between the wires and the bond pads.

Another disadvantage of the prior art is that the protective coating covering the bond pads prevents inspection of the bond pads after the circuit is completed. Because the bond pads cannot be inspected, it is more difficult to determine the cause of a failure. The protective coating also prevents defective wires and contacts from being reworked. As a result, when a failure occurs in a circuit packaged in accordance with the prior art, the entire assembly must be discarded.

In addition, the prior art is not well suited for automated processing. For example, it is time consuming and cumbersome to load an automatic dispenser with individual circuits, as required by the prior art. In addition, prior art methods and devices require regular human interaction or additional machinery, such as a die picking apparatus. The benefit derived from an automated systems highly accurate placement of the material is also unrealized because the prior art allows the protective coating to flow onto the bond pads.

The problems associated with the prior art result in increased time spent manufacturing circuits and increased costs associated with component failure and additional security required for unprotected circuits. Accordingly, a need exists for a device and a method that will permit efficient placement of coatings on circuits, early in their manufacture, while permitting high yields of operable circuits.

SUMMARY OF THE INVENTION

The present invention is directed to a corral for a circuit. The corral is disposed on the circuit between the active area and one or more bond pads. The corral may be filled with a protective coating to prevent reverse engineering of the circuit. A primer may be used with the protective coating.

The present invention is also directed to a method of forming a corral on a circuit. The method includes providing a circuit having an active area and one or more bond pads and forming a corral on the circuit between the active area and bond pads.

Those and other advantages and benefits of the present invention will become apparent from the description hereinbelow.

BRIEF DESCRIPTION OF THE DRAWINGS

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements found in a typical circuit. Those of ordinary skill in the art will recognize that other elements may be desirable or required to implement the present invention. However, because such elements are well known in the art, and because they do not facilitate a better understanding of the present invention, a discussion of such elements is not provided herein. The materials provided herein are illustrative and not the only manner of embodying the present invention.

Figure 1:
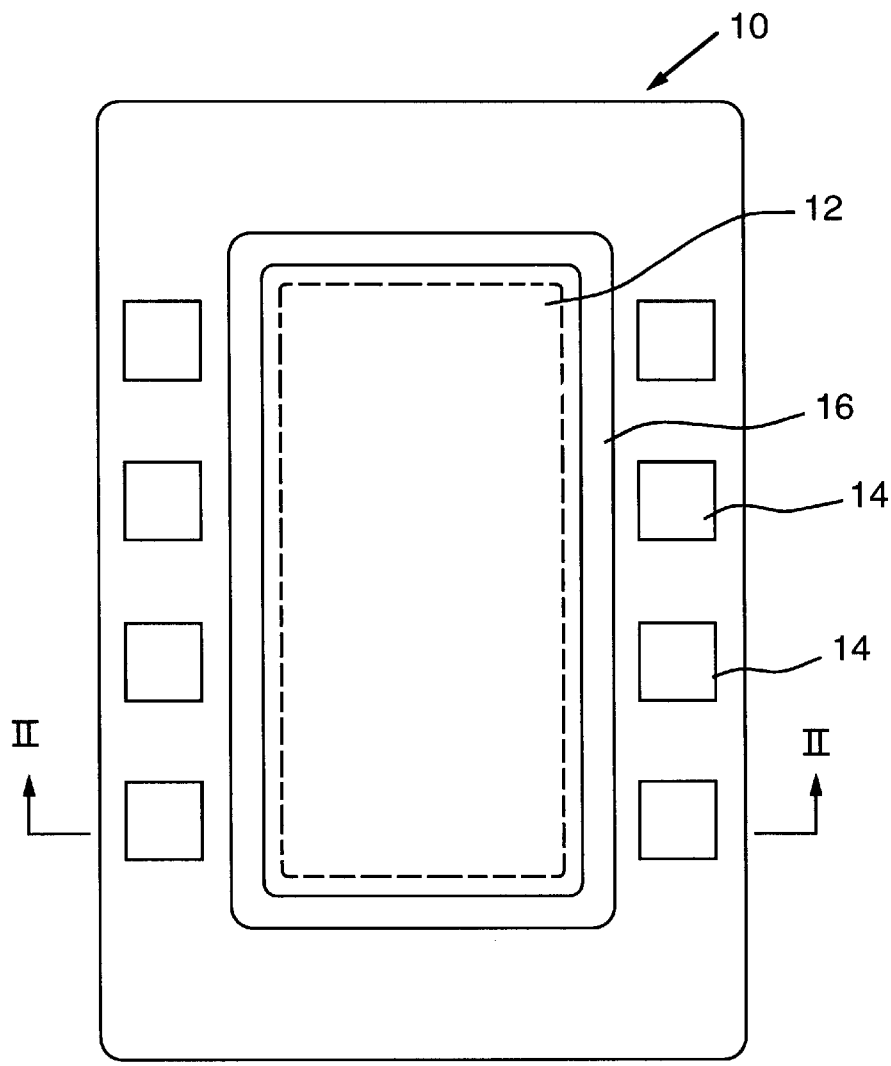
FIG. 1 is a top plan view of a circuit including a corral formed between an active area and bond pads.

FIG. 1 is a top view of a circuit 10 including an active area 12, bond pads 14, and a corral 16 formed between the active area 12 and bond pads 14. The circuit 10 may be fabricated using any one of many different technologies, including silicon-on-insulator technology, silicon-on-sapphire technology, thin film transistor technology, and conventional silicon substrate technology. The term circuit is used in this application in a broad sense to include any circuit having a number of components connected together. An obvious example is an integrated circuit. A circuit also includes a circuit formed of discrete components on a circuit board, multi-chip modules and hybrid circuits.

The corral 16 may be constructed from many materials and in many dimensions. The corral 16 may be formed on the circuit 10 between the active area 12 and the bond pads 14 so that the active area 12 may be covered by a coating 18 (illustrated in FIG. 4) and the bond pads 14 are not covered by the coating 18 (illustrated in FIG. 4). The corral 16 may, for example, touch neither the active area 12 nor the bond pads 14. Alternatively, the corral 16 may partially cover the active area 12 (illustrated in FIG. 7), or partially cover one or more bond pads 14 (illustrated in FIG. 8), or partially cover both the active area 12 and one or more bond pads 14 (illustrated in FIG. 9), although leaving enough of the bond pads 14 exposed for subsequent connections.

The corral 16 may be formed of an electrically insulative, thermally curable, viscous adhesive, such as an epoxy resin. While an electrically insulative material is not necessary, it is beneficial, particularly if the corral 16 covers the active area 12 and/or one or more bond pads 14. For example, an electrically insulative corral 16 is desirable when the corral 16 touches the active area 12 and/or one or more bond pads 14 because it does not promote shorting of the active area 12 or the bond pads 14. A thermally curable material may also be used, such as when the circuit 10 includes materials that are cured after the corral 16 has been formed. Higher viscosity materials are often selected because their use allows a higher walled corral 16 to be formed in a single step. Adhesives are not required, although they may be used if a means of fastening the corral 16 to the circuit 10 is needed.

The corral 16 may be built by selectively depositing or growing the walls of the corral 16. For example, an epoxy resin may be selectively deposited on the circuit 10 to form the corral 16. Alternatively, the corral 16 may be built by depositing or growing a material on all or part of the circuit 10 and then removing selected portions of that material to form the corral 16. For example, a photoresistive material may be placed over the entire circuit 10 and then selectively removed, such that a corral 16 of photoresistive material is formed around the active area 12. A corral 16 formed by a single application of a photoresistive material has been found to generally result in a lower corral 16 height than when formed by a single application of an epoxy resin.

Figure 2:
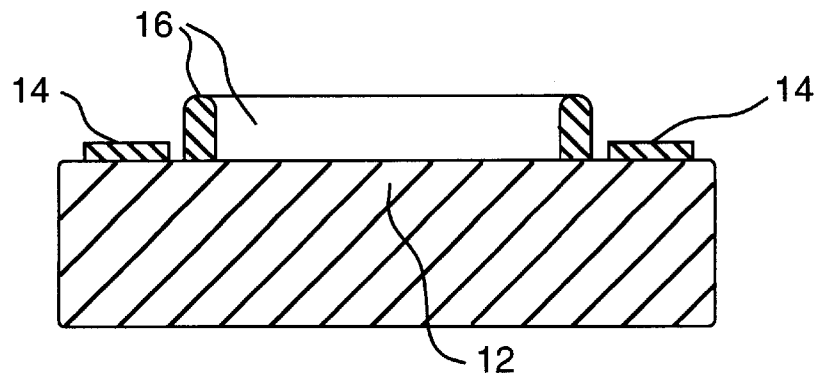
FIG. 2 is a cross-sectional view along line II—II of FIG. 1.
Figure 3:
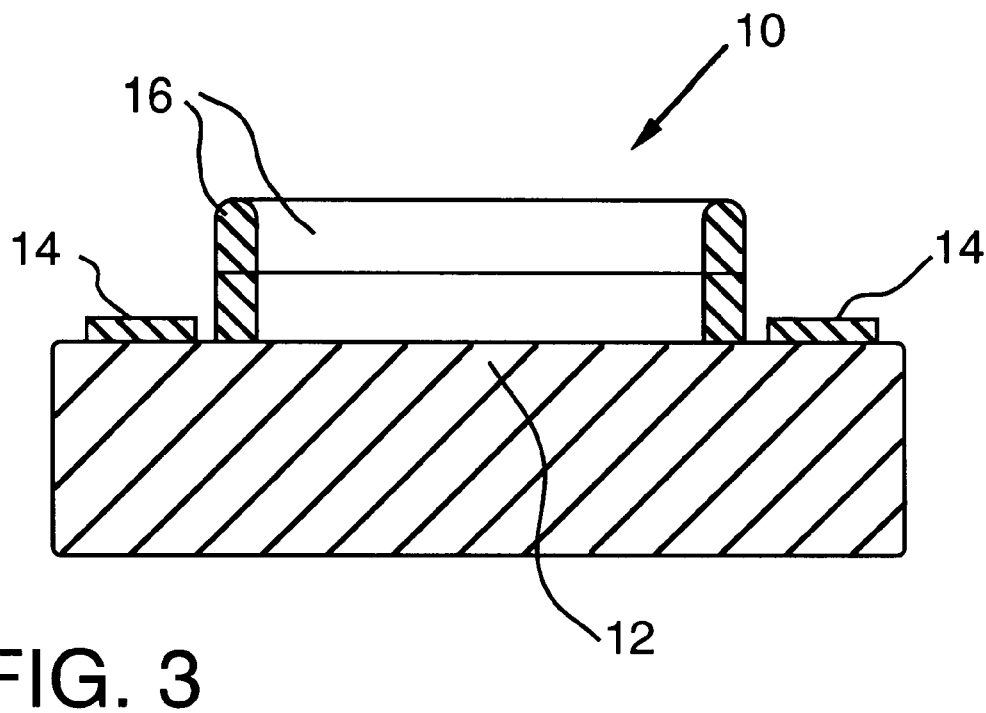
FIG. 3 is a cross-sectional view of a circuit including a corral formed in two layers.

FIG. 2 is a cross-sectional view along line II—II of the circuit 10 illustrated in FIG. 1, illustrating the corral 16 formed on the surface of the circuit 10. The corral 16 illustrated in FIG. 2 is formed as a single piece or layer. However, the corral 16 may also be formed from multiple pieces or layers, as illustrated in FIG. 3. A corral 16 formed from multiple pieces or layers may be used in circumstances where the corral 16 must have a height that is greater than may be formed by a single layer of material. Such a corral 16 may be made by forming a first layer of the corral 16, curing the first layer, forming a second layer on top of the first layer, and then curing the second layer. Alternatively, a corral 16 may be pre-formed and placed on a circuit 10. In the pre-formed embodiment a complete corral 16 may be formed separate from the circuit 10 and then attached to the circuit 10.

Figure 4:
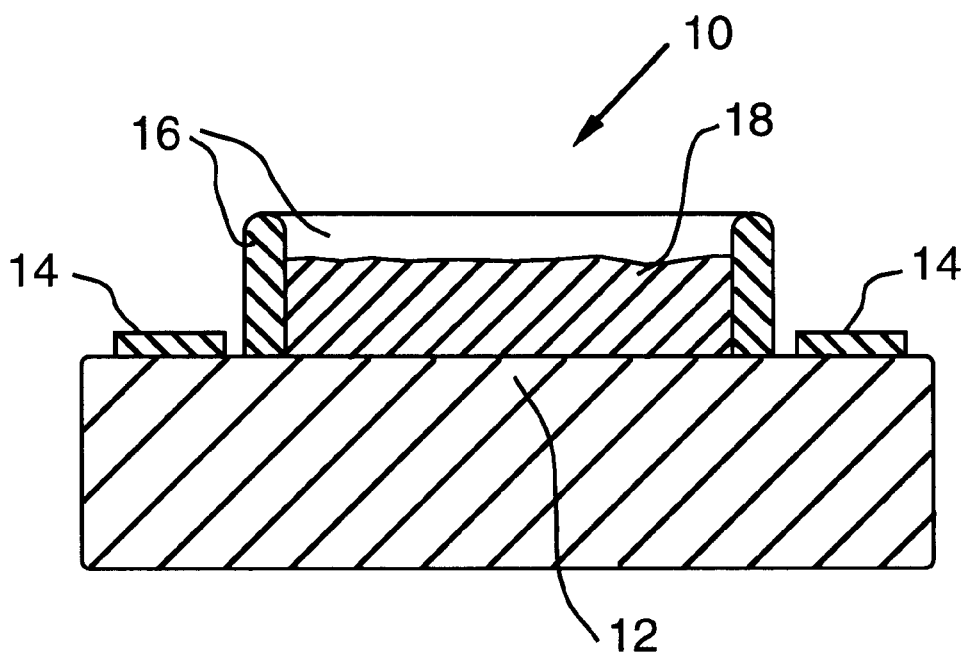
FIG. 4 is a cross-sectional view of a circuit including a coating bounded by the active area and the corral.

FIG. 4 is a cross sectional view of a circuit 10 after a protective coating 18 has be provided within the corral 16. The coating 18 covers the active area 12 and is within the boundaries formed by the corral 16. FIG. 4 illustrates the corral 16 partially filled with the protective coating 18, although the protective coating 18 may also completely fill the corral 16.

The corral 16 may be removed after the active area 12 has been covered by the coating 18, leaving the protective coating 18 on the circuit 10. For example, corrals 16 formed of photoresistive material may be removed by conventional techniques for removing photoresist. In practice, however, it has been found that it is unnecessary to remove the corral 16 because the corral 16 typically does not inhibit the functioning of the circuit 10. Furthermore, the additional handling and processing steps needed to remove the corral 16 add to the time and cost of fabricating the circuit 10, and may also increase the failure rate of the circuit 10.

The corral 16 permits the coating 18 to be easily applied, either manually or automatically. The coating 18 will be evenly distributed within the corral 16 and will not interfere with the bond pads 14 or other components laying outside of the corral 16. The corral 16 also provides for greater protection from reverse engineering because the protective coating 18 covers the active area 12 at a uniform thickness and does not thin out at the edges.

The corral 16 may be formed at any time after the circuit 10 is fabricated, thereby allowing the protective coating 18 to be applied at anytime thereafter. As a result, the circuit 10 can be protected earlier in the manufacturing process, thereby reducing the risk that the circuit 10 will be reverse engineered before it is packaged. Another advantage of applying the protective coating 18 early in the manufacturing process is that it allows the protective coating 18 to be applied before the encryption is coded onto the circuit 10, thereby eliminating a vulnerability present with the prior art. In addition, a circuit 10 that is encrypted after the protective coating 18 is applied may avoid a more restrictive classification by the government, thereby reducing handling and security costs.

Yet another advantage of the present invention is that it allows a circuit 10 to be encrypted after the protective material 18 is cured, thereby eliminating the risk of exposing an encrypted circuit 10 to high curing temperatures and eliminating a source of failure in the prior art.

Another advantage of the present invention is that the corral 16 prevents the coating 18 from covering the bond pads 14, permitting visual inspection of the bond pads 14 and any connections to the bond pads 14. As a result, bond pads 14 and connections thereto may be reworked during subsequent processing and inspection steps.

The protective material 18 may be any one or more of many materials, including tamper resistant materials, opaquing materials, and materials placed to protect the circuit 10 from outside forces including ultraviolet light, static electricity and impact. For example, tamper resistant materials include epoxy resin mixtures, meshes, fibrous mixtures, ceramics, and alumina impregnated materials, such as zircon, topaz and garnet. Some of those materials also act as opaquing materials and offer protection from outside forces. The coating 18 may include more than one of those materials, and may also include a primer material.

Figure 5:
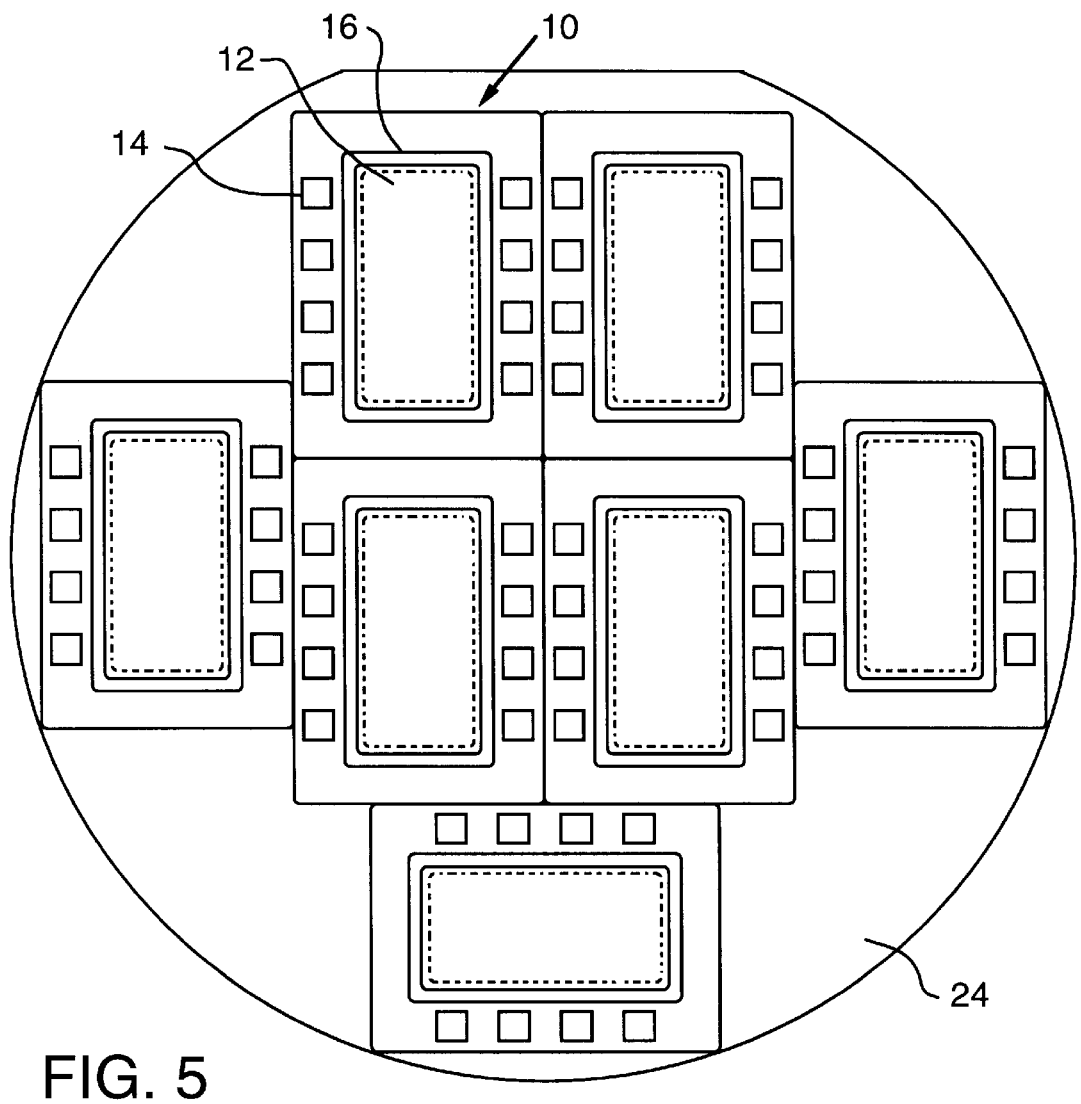
FIG. 5 is a top plan view of a wafer including multiple circuits on which corrals are formed in accordance with the present invention.

FIG. 5 illustrates a wafer 24 including a number of circuits 10, each having a corral 16. Coatings 18 may also be placed on the circuits 10 prior to dicing of the wafer 24. One reason for forming the corrals 16 and providing protective coatings 18 when the circuits 10 are in wafer form is that it affords a greater efficiency because a wafer 24 can generally be processed more quickly than diced circuits 10. Alternatively, the corral 16 may be formed and the protective coating 18 may be provided after the circuits 10 have been diced from a wafer 24.

Figure 6:
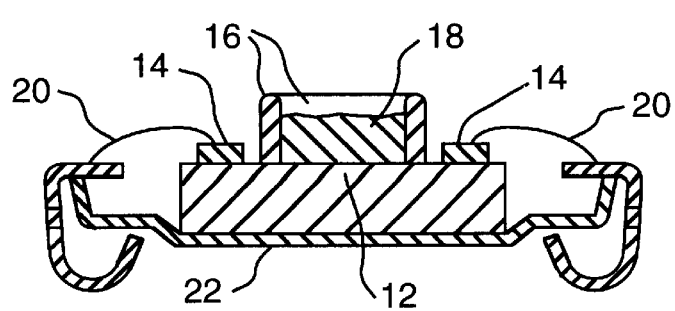
FIG. 6 is a cross-sectional view of a circuit attached to a package.

FIG. 6 is a cross-sectional view of the circuit 10 after wires 20 have been attached between the bond pads 14 and the package 22. As discussed hereinabove, the corral 16 prevents the coating 18 from covering the bond pads 14, thereby leaving the bond pads 14 exposed for later attachment by wires 20. Another advantage of the present invention is that when the protective coating 18 is provided early in the processing of the circuit, the wires 20 do not contact the protective coating 18 and are not exposed to high curing temperatures, thereby eliminating a source of failure in the prior art.

The present invention also includes a method for forming a corral 16 on a circuit 10. The method includes providing a circuit including an active area 12 and one or more bond pads 14 and forming a corral 16 on the circuit 10 between the active area 12 and the bond pads 14. The corral 16 may be formed by any methods including, for example, automatic or manual formation or by attaching a pre-formed corral 16 to a circuit 10. A corral 16 of the present invention may be formed from one or more layers or pieces of corralling material. For example, if epoxy resin is used to form the corral 16, the first layer may be formed on the circuit 10 and the first layer may be cured at approximately 110° C. for a period of about 30 minutes. A second layer of epoxy resin may then be formed on top of the first layer and cured at approximately 170° C., for a period of about 60 to about 120 minutes. It will be obvious to those skilled in the art that other forming and curing steps may also be taken to achieve the resulting corral 16.

Another method of forming a corral 16 of the present invention is by forming photoresistive material on a circuit 10 and then removing selected areas of photoresistive material to create a corral 16. Corrals 16 may also be removed. For example a corral 16 formed of photoresistive material, or epoxy resin on photoresistive material, may be removed by conventional process techniques.

The present invention may include placing one or more coatings 18, such as primer and/or tamper resistant material, on the active area 12. Use of the corral 16 permits the placement of the coatings 18 early in the manufacture of a circuit 10. For example, placing coatings 18 on a circuit 10 may occur prior to encrypting the circuit 10.

The present invention may also include a method for attaching a package 22 or wires 20 to a circuit 10 after a protective coating 18 is formed on the circuit 10. For example, after the coating 18 has been formed, the package 22 may be attached to the circuit 10, one end of a wire 20 may be attached to a bond pad 14 and the other end of the wire 20 may be attached to the package 22. Additional wires 20 may also be similarly attached. That is permitted because the corral 16 confines the coatings 18 to the active area 12 so that the bond pads 14 remain exposed. The prior art does not permit a package 22 or wires 20 to be attached after the coatings 18 are placed because the coatings 18 typically cover one or more of the bond pads 14 and once a bond pad 14 is covered it may no longer be used to attach the circuit 10 to the package 22. Once the covered circuit 10 is attached to a package 22 or wires 20, the present invention offers the additional benefit of permitting wires 20 to be inspected, reworked or removed and replaced with new wires 20. That is again possible because of the corral 16, which prevents coatings 18 from covering bond pads 14, thereby allowing access to the bond pads 14.

Figure 7:
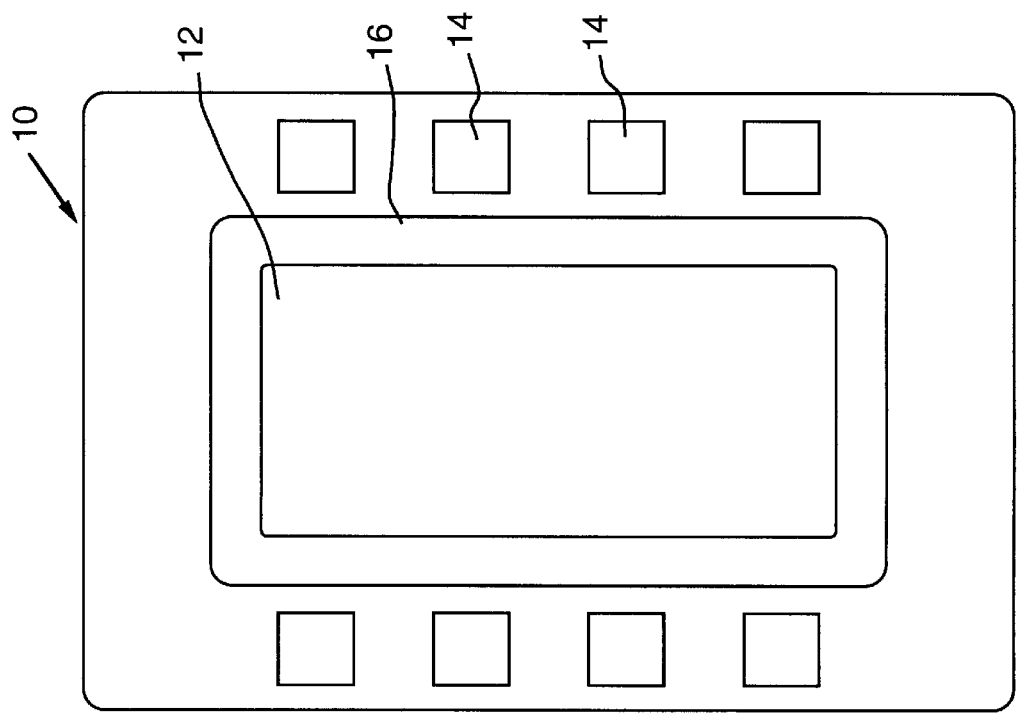
FIG. 7 is a top plan view of a circuit of the present invention including a corral that partially covers the active area of the circuit.
Figure 8:
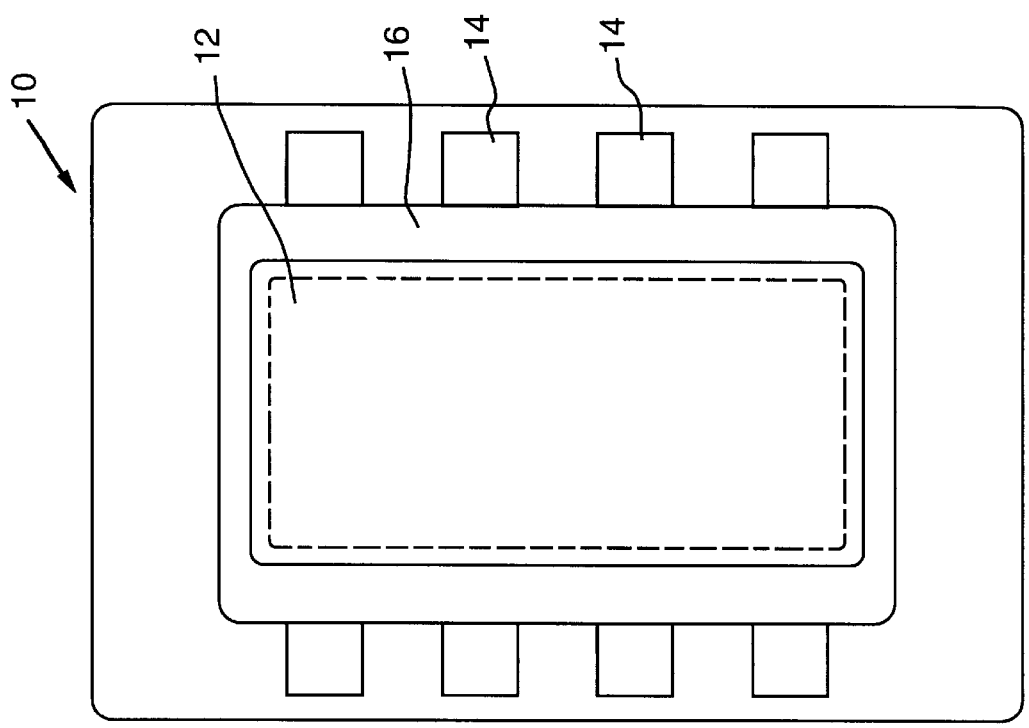
FIG. 8 is a top plan view of a circuit of the present invention including a corral that partially covers the bond pads of the circuit.
Figure 9:
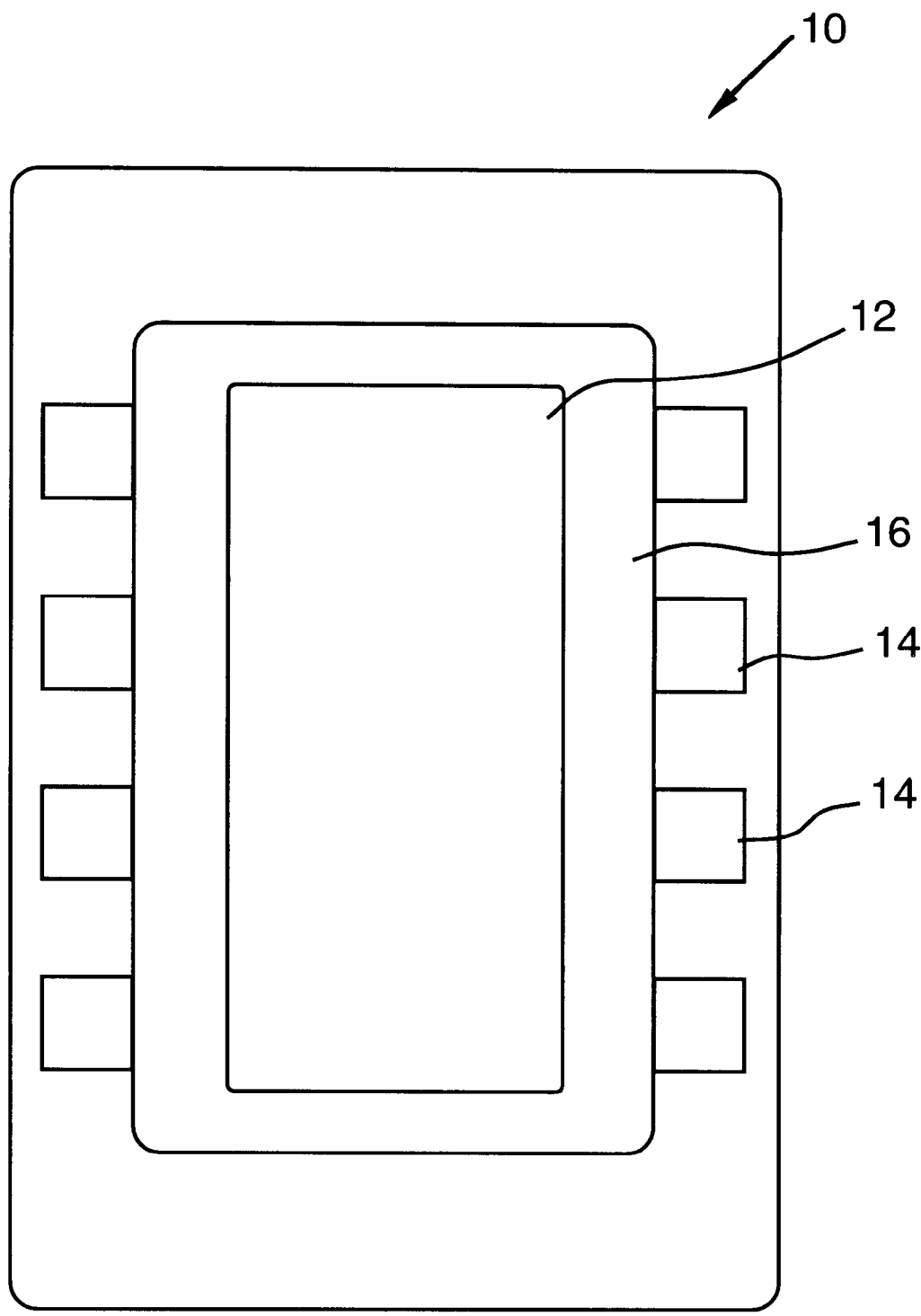
FIG. 9 is a top plan view of a circuit of the present invention including a corral that partially covers both the active area and bond pads of the circuit.

FIG. 7 illustrates a corral 16 partially covering the active area 12 of a circuit 10. FIG. 8 illustrates a corral 16 partially covering the bond pads 14 of a circuit 10. FIG. 9 illustrates a corral 16 partially covering both the active area 12 and bond pads 14 of a circuit 10.

Those of ordinary skill in the art will recognize that many modifications and variations of the present invention may be implemented. The foregoing description and the following claims are intended to cover all such modifications and variations. Furthermore, the materials and processes disclosed are illustrative of the invention but are not exhaustive. Other materials and processes may also be used to utilize the present invention.

What is claimed is:

1. An integrated circuit die including an active area containing electronic circuits and at least one bond pad in a peripheral area of the die, comprising a corral formed on the die between the active area and the bond pad.

2. The device of claim 1, wherein said corral covers part of the active area.

3. The device of claim 1, wherein said corral covers part of the bond pad.

4. The device of claim 1, wherein said corral covers part of the active area and part of the bond pad.

5. The device of claim 1, wherein said corral covers neither the active area nor the bond pad.

6. The device of claim 1, wherein said corral is formed from at least one layer.

7. The device of claim 6, wherein said corral is formed from a plurality of layers.

8. The device of claim 1, wherein said corral is an electrically insulative, thermally curable adhesive.

9. The device of claim 8, wherein said corral is formed from a material selected from a group consisting of epoxy resins and photoresistive materials.

10. The device of claim 1, further comprising a tamper resistant coating formed within said corral.

11. The device of claim 10, wherein said tamper resistant coating includes a component selected from a group consisting of primers, epoxy resins, ceramics, meshes, fibers, and alumina impregnated materials.

12. The device of claim 10, wherein said tamper resistant coating includes a primer.

13. The device of claim 1, wherein said corral is removable.

14. The device of claim 1, wherein said die is part of a semiconductor wafer.

15. The device of claim 1, wherein said die has been diced from a wafer.

16. The device of claim 1, further comprising:

a package attached to said; and at least one wire having a first end attached to the bond pad and a second end attached to said package.

* * * * *